United States Patent
Wickramanayaka et al.

(10) Patent No.: US 7,159,537 B2
(45) Date of Patent: Jan. 9, 2007

(54) DEVICE FOR FIXING A GAS SHOWERHEAD OR TARGET PLATE TO AN ELECTRODE IN PLASMA PROCESSING SYSTEMS

(75) Inventors: Sunil Wickramanayaka, Tama (JP); Masahito Ishihara, Fuchu (JP); Yoshikazu Nozaki, Palo Alto, CA (US); Hiroshi Doi, Chofu (JP)

(73) Assignee: Anelva Corporation, Fuchu (JP)

( * ) Notice: Subject to any disclaimer, the term of this patent is extended or adjusted under 35 U.S.C. 154(b) by 428 days.

(21) Appl. No.: 10/874,535

(22) Filed: Jun. 24, 2004

(65) Prior Publication Data
US 2005/0028935 A1 Feb. 10, 2005

(30) Foreign Application Priority Data
Jun. 25, 2003 (JP) .............................. 2003-181158

(51) Int. Cl.
C23C 16/455 (2006.01)
C23C 16/503 (2006.01)
C23C 16/00 (2006.01)
C23C 14/34 (2006.01)

(52) U.S. Cl. .............. 118/723 E; 118/715; 204/298.12; 156/345.34; 156/345.47

(58) Field of Classification Search ................ 118/715, 118/723 E; 204/298.12; 156/345.33, 345.34, 156/345.43, 345.47
See application file for complete search history.

(56) References Cited

U.S. PATENT DOCUMENTS

| 6,432,261 B1* | 8/2002 | Watanabe et al. ...... 156/345.47 |
| 2001/0008173 A1* | 7/2001 | Watanabe et al. ........... 156/345 |
| 2005/0028935 A1* | 2/2005 | Wickramanayaka et al. ..... 156/345.34 |

FOREIGN PATENT DOCUMENTS

| JP | 07-335635 | 12/1995 |
| JP | 2001-267295 | 9/2001 |
| JP | 2001-267297 | 9/2001 |

* cited by examiner

*Primary Examiner*—Jeffrie R. Lund
(74) *Attorney, Agent, or Firm*—Buchanan Ingersoll & Rooney PC

(57) ABSTRACT

A plasma processing system includes a reactor, a top electrode made of a magnetic or ferromagnetic metal or a metal-alloy, wherein a RF or DC power is applied to generate plasma within the reactor; a gas showerhead fixed to the top electrode; a sheet-like magnetic assembly bound to the upper surface of the gas showerhead, which includes a plurality of separate magnets, a metal sheet made of a ferromagnetic metal, and a deformable film.

27 Claims, 13 Drawing Sheets

DEVICE FOR FIXING A GAS SHOWERHEAD OR TARGET PLATE TO AN ELECTRODE IN PLASMA PROCESSING SYSTEMS

BACKGROUND OF THE INVENTION

1. Field of the Invention

The present invention relates to a device for fixing a gas showerhead or target to an RF or DC electrode in a plasma processing system. More particularly, the present invention relates to a technique to fix the gas showerhead used in plasma assisted chemical vapor depositions or dry etching systems, or the target used in plasma assisted sputter deposition systems to improve the thermal conductance from the showerhead or target to the RF or DC electrode and the gas distribution below the showerhead.

2. Description of the Related Art

Plasma assisted wafer processing technique is well-accepted method in semiconductor device manufacturing industry. Two major plasma generation techniques are the RF (Radio Frequency) plasmas and the DC (Direct Current) plasmas with parallel plate configuration, where RF or DC electrode is in parallel with a wafer surface. In most such plasma assisted wafer processing reactors there is a gas showerhead or target plate fixed to the RF or DC electrode. Generally, a showerhead is fixed to the RF or DC electrode in chemical vapor depositions and dry etching reactors, while a target plate is fixed to the RF or DC electrode in sputter deposition reactors.

Magnetic field applied plasma processing reactors are currently being used in dry etching applications.

At present, the showerhead or target plate is fixed to the RF or DC electrode by using bolts or a ring-shaped flange placed around the showerhead or target. This method of fixing poses two major problems. The first problem is insufficient thermal conductance between the showerhead or target and the electrode, and the second problem is non-uniform gas distribution below the showerhead. These problems are explained with reference to FIGS. 18 and 19.

For the ease of explanation, for example, a point-cusp magnetic field applied RF plasma processing system used for dry etching applications is selected (for example, JP-A-07-335635). A cross sectional view of the dry etching reactor 100 is shown in FIG. 18, in which plasma is generated by capacitively coupled mechanism. This plasma processing system is comprised of a top electrode 101, lower electrode 102, insulating materials 103 (103a, 103b) and 104 to electrically isolate electrodes 101 and 102 from the rest of the reactor 100, and a showerhead 105. The top electrode 101 is made of a metal usually aluminum and is cooled by flowing liquid through canals 106 made within the top electrode 101. The cooling is important in order to reduce or maintain a constant temperature at the gas showerhead 105.

There is a plurality of magnets 122 separately arranged on the outer surfaces of top electrode 101. The magnets 122 are arranged in a non-circular configuration with respect to a center of said top electrode 101. The magnets 122 are arranged in an orthogonal configuration along perpendicular lines such that a polarity of each of the magnets facing the inside of the reactor is opposite to that of linearly adjacent magnets and the same as diagonally adjacent magnets. These magnets 122 generate a magnetic field with closed magnetic fluxes near the inner surfaces of the top electrode 101.

In addition, there is gas reservoir 107 within the top electrode 101. A plurality of gas inlets 108 is made from this gas reservoir 107 to the inside of the reactor 100. Use of the gas showerhead 105 is very important for most of the dry etching processing in order to obtain a uniform etch rate on the substrate surface.

The top electrode 101 is supplied a RF power from a RF generator 109 via a matching circuit 110. Similarly, another RF current from a RF generator 111 is supplied to the lower electrode 102 via a matching circuit 112. The frequencies of RF currents applied to the electrodes 101 and 102 are not important for the present invention. Therefore, here, the frequencies are not discussed in detail.

In addition, JP-A-2001-267297 and JP-A-2001-267295 are cited as the other related arts.

Generally, the showerhead 105 is made of a semiconductor (e.g. Si) or a dielectric material (e.g. Quartz). The showerhead 105 is usually fixed to the top electrode 101 by using only its outermost region, typically about 2–5 mm wide band at the edge. The gas showerhead 105 shown in FIG. 18 is fixed to the top electrode 101 by using a ring-shaped dielectric ring 103a, which is fixed to another dielectric ring 103b using a plurality of bolts 113. Or one can fix the showerhead 105 to the top electrode 101 directly by the bolts 113 as shown in FIG. 19 without using the dielectric ring 103a. In either way, the showerhead 105 is attached to the top electrode 101 only by its outermost region.

Even though the lower surface of the top plate 101 and the upper surface of the showerhead 105 are taken as planar as possible, the showerhead 105 makes contact with the top electrode 101 only at its outermost region. Generally, the central region of the showerhead 105 bends due to its weight as shown in FIG. 19. Due to this bending, a very thin gas reservoir 114 is made between the lower surface of the top electrode 101 and the upper surface of the showerhead 105. This causes two problems.

The first problem is the reduction of thermal conductance between the showerhead 105 and the top electrode 101. During the plasma processing, the plasma heats the showerhead 105. This heat must be efficiently transferred to the top electrode 101 in order to reduce the temperature rise of the showerhead 105. However, since the showerhead 105 is attached to the top electrode 101 only by its edges, heat transfer occurs only through the edge of showerhead 105. This causes a higher temperature gradient between the center and the edge in the showerhead 105. Maintaining an almost constant temperature on the entire surface of showerhead 105 is of important for most of the dry etching applications. Because non-uniform temperature on the showerhead 105 changes the chemistry of process gas below the showerhead 105, it adversely affects the process on the wafer surface.

The second problem is that due to the formation of the thin gas reservoir 114 between the top electrode 101 and the showerhead 105, the gas inlets 108 from gas reservoir 107 to reactor 100 discontinue. This causes process gas leak into the thin-gas-reservoir 114. The gas pressure within the thin-gas-reservoir 114 tends to increase at its center. Because of this reason, a higher amount of process-gas begins to come from the central region of the showerhead 105. This changes the uniformity of process-gas flux into the reactor 100 and thereby the uniformity of gas chemistry below the showerhead 105. This matter results in non-uniform etch rate on the surface of the wafer 115.

Even though the above two problems are explained using a dry etching reactor, the same problems exist in most of the other plasma assisted wafer processing reactors with or without the magnetic field assistance.

OBJECTS AND SUMMARY

An object of the present invention is to provide a device for fixing a gas showerhead or target to a RF or DC electrode in plasma processing systems, being capable of improving the thermal conductance from the showerhead or target to the RF or DC electrode and improving the gas distribution below the showerhead.

The device and the electrode unit of embodiments of the present inventions are configured as follows.

The device for fixing a gas showerhead or target plate to an electrode in a plasma processing system, is comprised of a reactor; a top electrode made of a magnetic or ferromagnetic metal, or a magnetic or ferromagnetic metal-alloy which has at least ferromagnetic properties, wherein a RF or DC power is applied to generate plasma within the reactor; a gas showerhead or target plate fixed to the top electrode; a sheet-like magnetic assembly bound to an upper surface of the showerhead or target plate, which is comprised of a plurality of separate magnets, a metal sheet made of a ferromagnetic metal, and a deformable film.

The device for fixing a gas showerhead or target plate to an electrode in a plasma processing system, is comprised of a reactor; a top electrode made of a metal, wherein a RF or DC power is applied to generate plasma within the reactor; a gas showerhead or target plate to be fixed to the top electrode; a thin plate made of magnetic metal or metal alloy, or ferromagnetic metal which is attached to a lower surface of the top electrode; and a sheet-like magnetic assembly bounded to the upper surface of the showerhead or target plate, which is comprised of a plurality of separate magnets, a metal sheet made of a ferromagnetic metal, and a deformable film.

The device for fixing a gas showerhead or target plate to an electrode in a plasma processing system, is comprised of a reactor; a top electrode made of a metal, wherein a RF or DC power is applied to generate plasma within the reactor; a gas showerhead or target plate to be fixed to the top electrode; a plurality of separate magnets arranged within the lower surface section of the top electrode; and a sheet-like magnetic assembly bounded to the upper surface of the showerhead or target plate, which is comprised of a plurality of separate magnets, a metal sheet made of a ferromagnetic metal, and a deformable film.

The device for fixing a gas showerhead or target plate to an electrode in a plasma processing system, is comprised of a reactor; a top electrode made of a metal, wherein a RF or DC power is applied to generate plasma within the reactor; a gas showerhead or target plate to be fixed to the top electrode; a plurality of separate magnets arranged within the lower surface section of the top electrode; and a plurality of separate magnets separately fixed to the upper surface of the showerhead or target plate, wherein the position of the magnets overlap with those placed within said top electrode; wherein the magnets within the top electrode and the magnets on the showerhead or target plate are arranged such that attractive forces are generated between any two magnets which lie in the same magnetic axes.

In the device for fixing a gas showerhead or target plate to an electrode in a plasma processing system, the showerhead or target plate has a thin ferromagnetic metal sheet on its upper surface without magnets.

The device for fixing a gas showerhead or target plate to an electrode in a magnetic field assisted plasma processing system, is comprised of a reactor; a top electrode made of a nonmagnetic metal, wherein a RF or DC power is applied to generate plasma within the reactor; a plurality of magnets separately arranged within the inner surface section of the top electrode in order to generate closed magnetic fluxes near the inner surface of the top electrode; and a gas showerhead or target plate fixed to the top electrode, wherein a magnetic metal is arranged to the upper surface of the gas showerhead or the target plate.

In the device for fixing a gas showerhead or target plate to an electrode in a magnetic field assisted plasma processing system, the magnets are arranged in a noncircular configuration with respect to a center of the top electrode and in an orthogonal configuration along perpendicular lines such that a polarity of each of the magnets facing the inside of the reactor is opposite to that of linearly adjacent magnets and the same as diagonally adjacent magnets.

In the device for fixing a gas showerhead or target plate to an electrode in a magnetic field assisted plasma processing system, the magnets are arranged on the heads of hexagonals, which lie as a honeycomb structure such that a polarity of each of the magnets facing the inside of the reactor is opposite to that of linearly adjacent magnets.

In the device for fixing a gas showerhead or target plate to an electrode in a magnetic field assisted plasma processing system, the magnetic metal is a plurality of separate thin magnetic metal plates, and the separate thin metal plates are arranged to be aligned with each of the magnets or with only selected one of them within the top electrode, and at least a part of the surface area of the thin magnetic metal plate lies just below the relevant magnet.

In the device for fixing a gas showerhead or target plate to an electrode in a magnetic field assisted plasma processing system, the magnetic metal is a single thin metal sheet.

In an electrode unit through which a RF or DC power is applied to generate plasma within an reactor, which is used for plasma processing of substrates and is provided with a gas showerhead or target on its surface facing the inside of the reactor, the electrode is made of material having ferromagnetic property, and a sheet-like magnetic assembly is bonded to the upper surface of the showerhead or target plate, which is comprised of a plurality of separate magnets, a metal sheet made of a ferromagnetic metal and a deformable film.

In the electrode unit through which a RF or DC power is applied to generate plasma within an reactor, which is used for plasma processing of substrates and is provided with a gas showerhead or target on its surface facing the inside of the reactor, the electrode is made of metal, a thin plate made of material having ferromagnetic property is attached to the surface of the electrode, and a sheet-like magnetic assembly is bonded to the upper surface of the showerhead or target plate, which is comprised of a plurality of separate magnets, a metal sheet made of a ferromagnetic metal and a deformable film.

In the electrode unit through which a RF or DC power is applied to generate plasma within an reactor, which is used for plasma processing of substrates and is provided with a gas showerhead or target on its surface facing the inside of the reactor, the electrode is made of metal, a plurality of separate magnets is arranged within the electrode, and a sheet-like magnetic assembly is bonded to the upper surface of the showerhead or target plate, which is comprised of a plurality of separate magnets, a metal sheet made of a ferromagnetic metal and a film.

In the electrode unit, an sheet provided with a plurality of magnets is attached to the upper surface of the showerhead or target plate, instead of the sheet-like magnetic assembly.

A technique is invented to fix the showerhead or target to the RF or DC electrode by using magnetic force, which increases the contact-surface-area between the showerhead or target with the electrode, and eliminates the formation of thin-gas-reservoir between the electrode and the showerhead. This improves the temperature uniformity of the showerhead or target and gas distribution below the showerhead.

In accordance with the embodiments of the present inventions, since it is possible to fix the showerhead or target to the RF or DC electrode by using magnetic force, the contact-surface-area between the showerhead or target with the electrode can be increased, and the formation of thin-gas-reservoir between the electrode and the showerhead can be eliminated. Therefore, the embodiments can improve the temperature uniformity of the showerhead or target and gas distribution below the showerhead.

BRIEF DESCRIPTION OF THE DRAWINGS

These and other objects and features of the present invention will become clearer from the following description of the preferred embodiments given reference to the attached drawings, wherein.

DESCRIPTION OF THE PREFERRED EMBODIMENTS

Figure 1:
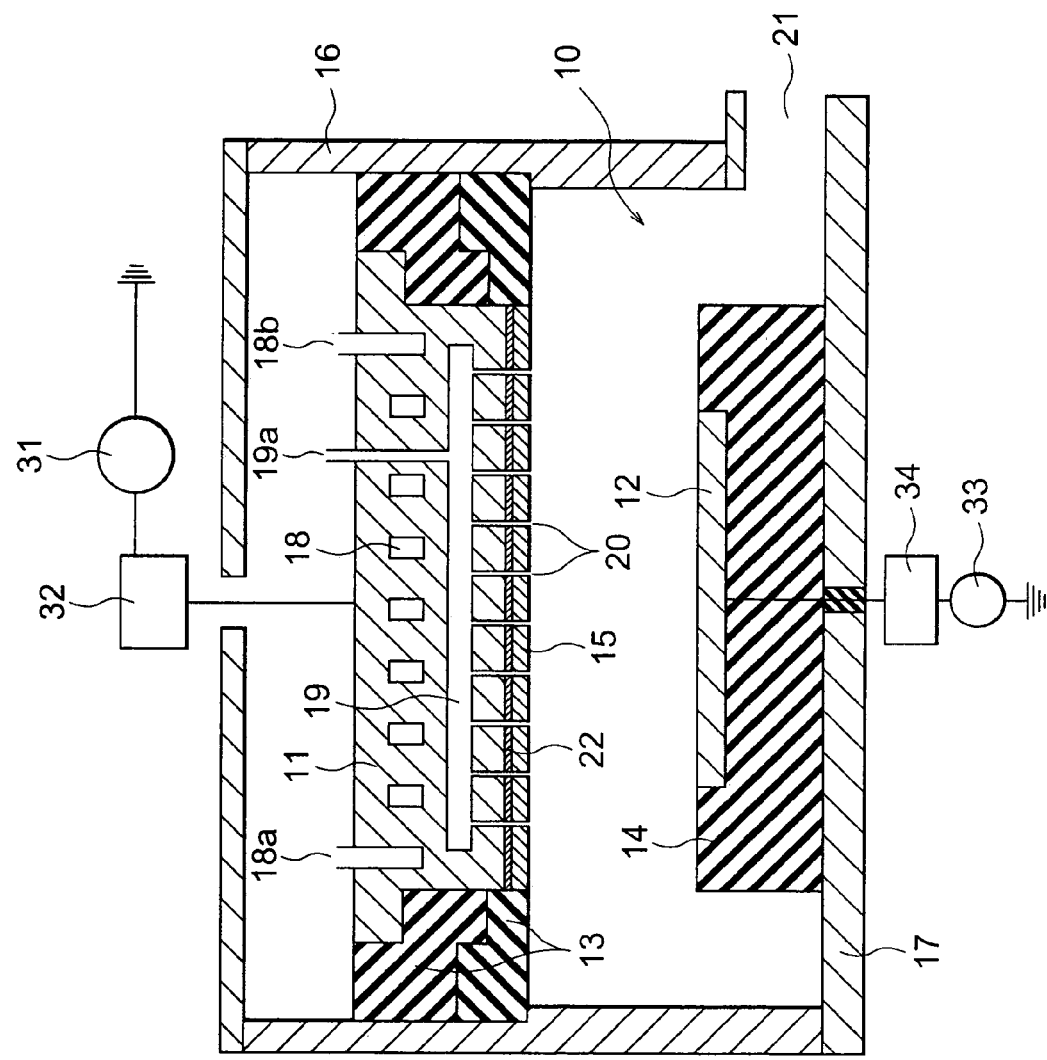
FIG. 1 is a longitudinal cross sectional view of a dry etching reactor of the first embodiment.

Hereinafter, preferred embodiments will be explained according to the attached drawings. It is noted that, through all of embodiments that are explained as follows, substantially identical elements are designated with same reference numerals.

In accordance with FIG. 1 the first embodiment of the present invention is explained. The first embodiment shows a dry etching apparatus. The technique of the present invention can be used for many different plasma processing apparatuses. In the first embodiment, a reactor for the dry etching apparatus is used for ease explanation.

FIG. 1 shows a longitudinal cross sectional view of a dry etching reactor of the first embodiment. In the dry etching reactor 10 plasma is generated by capacitively coupled mechanism. The dry etching reactor 10 is comprised of a top electrode 11, lower electrode 12, insulating materials or dielectric materials (13 and 14), and gas showerhead 15. The insulating material 13 has a ring shape and is fixed to the inside of a cylindrical side-wall 16. The insulating material 13 is a base member arranged on the bottom plate 17. The insulating material 13 supports the top electrode 11 using engagement step structure. The lower electrode 12 is arranged on the upper surface of the insulating material 14. The insulating materials 13 and 14 electrically isolate the electrodes 11 and 12 from the rest of the reactor 10 respectively. In case of the first embodiment, the top electrode 11 is preferably made of ferromagnetic metal such as iron and is cooled by flowing liquid through canals 18 made within the top electrode 11. The canals 18 have an introducing port 18a and drain port 18b. The cooling is important in order to reduce or maintain a constant temperature at the gas showerhead 15. In addition, there is a gas reservoir 19 within the top electrode 11. The gas reservoir 19 has a gas introduction port 19a connecting to a gas feeder. A plurality of gas inlets 20 is made to supply a gas from the gas reservoir 19 to the inside space of the reactor 10. The plurality of gas inlets 20 are also formed in a sheet-like magnetic assembly 22 and the gas showerhead 15. The holes for the gas inlets 20 are respectively in the sheet-like magnetic assembly 22 and the gas showerhead 15. The gas showerhead 15 has many holes as the gas inlets enough to introduce the gas widely and uniformly within the inside space of the reactor 10. The holes for the gas inlets in the unit comprised of the sheet-like magnetic assembly 22 and the gas showerhead 15 are made by two ways. One way is to make them in the unit after making it. Another way is to making them by optionally placing the magnets so as to have many holes in the unit. Further, the dry etching reactor 10 has a gas outlet 21 at its lower portion of the side-wall 10.

The top electrode 11 is supplied a RF power from a RF generator 31 via a matching circuit 32. Similarly, another RF current from a RF generator 33 is supplied to the lower electrode 12 via a matching circuit 34. The frequencies of RF currents applied to the electrodes 11 and 12 are not important for the present invention. Therefore, here, the frequencies are not discussed in detail.

The above showerhead 15 is usually made of a dielectric or a semiconductor material, for example Si. However, depending on the type of process one can use different materials for the showerhead 15.

Figure 2:
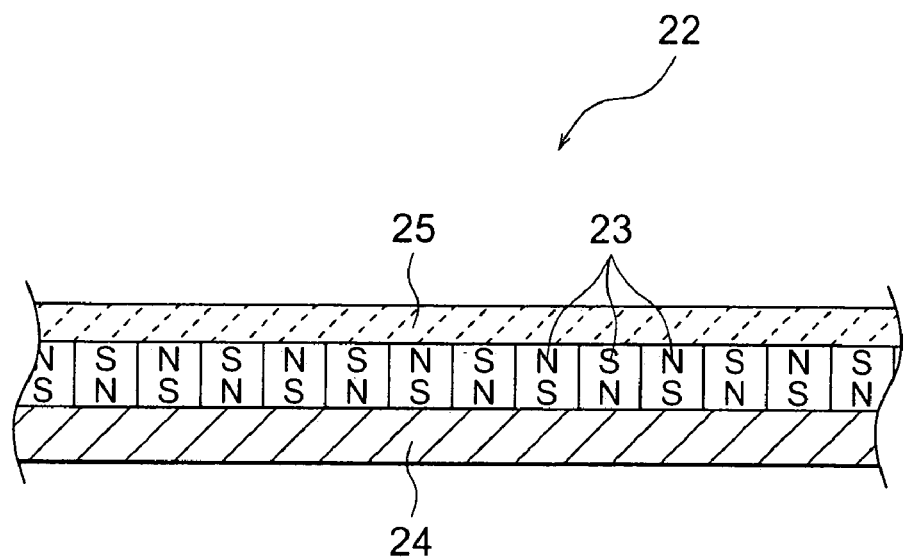
FIG. 2 is the enlarged longitudinal cross sectional view of the sheet-like magnetic assembly.
Figure 3:
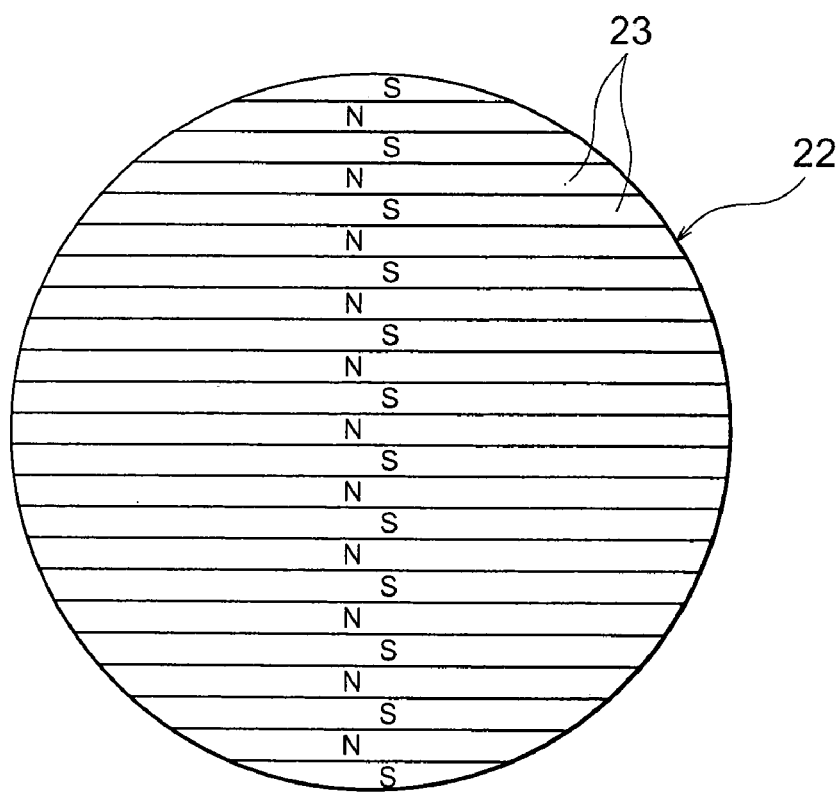
FIG. 3 is a plane view of the magnets of the sheet-like magnetic assembly showing arrangement of long magnetic stripes.

There is a sheet-like magnetic assembly 22 bonded on the upper surface of gas showerhead 15. The enlarged longitudinal cross sectional view of the sheet-like magnetic assembly 22 is partially shown in FIG. 2. In the sheet-like magnetic assembly 22, there are many magnets 23 arranged between a ferromagnetic metal sheet 24 and a deformable film 25. The magnets 23 are placed with alternate polarity as shown in FIG. 2. FIG. 3 shows the upper view of the magnet arrangement. The alternate polarity arrangement by the magnets 23 is clearly indicated in FIG. 3.

The cross sectional shape of the magnets 23 is not critical. Usually, the thickness of the magnets 23 is about 1 mm, for example. Long magnetic stripes are selected as the plane shape for the magnets 23 as shown in FIG. 3. Each of many magnets 23 with a long stripe shape has a different length so that they make a round plane shape. However, one can use a completely different magnet arrangement to obtain the same result. For example, separate square magnets can be placed attached to each other with alternate polarity.

The bonding between each of the magnets 23 and the metal sheet 24 is carried out using glue with high thermal conductivity. The strength of the magnetic field of the magnet 23 is not critical, usually a very weak magnetic field, that is smaller than 100 Gauss, for example.

The metal sheet 24 is made of a ferromagnetic metal, for example. The thickness of the metal sheet 24 is preferably smaller than 5 mm, for example. The purpose of the metal sheet 24 is to prevent the penetration of magnetic flux to the lower surface of the showerhead 15. The plasma is generated in the space below the showerhead 15. If the penetration of the magnetic flux below the lower surface of the showerhead 15 is not a problem for the plasma processing of wafer, the use of the metal sheet 24 is not necessary. Further, when selecting a thicker showerhead whose thickness is about 10 mm, for example, or very weak magnets, the use of the metal sheet 24 can be eliminated. Because, this condition does not yield the magnetic field that penetrates below the showerhead 15.

The thickness of the deformable sheet 25 is usually as thin as possible. For example, the thickness is preferably smaller than about 1 mm. The deformable sheet 25 is preferably made of materials such as carbon, silicon, or a similar material. The role of the deformable sheet 25 is to increase a contact-surface-area between the top electrode 11 and the sheet-like magnetic assembly 22. The increase of the contact-surface-area improves the thermal conductance between the showerhead 15 and the top electrode 11. This structure results in a more uniform temperature distribution on the showerhead 15. Further, this structure does not have any voids between the showerhead 15 and the top electrode 11. Therefore, the discontinuation of the gas inlets from the gas reservoir 19 to the inside of the reactor 10 is prevented. A uniform gas distribution is attained in the space below the showerhead 15.

In addition, the above deformable sheet 25 is not an essential element for this invention.

In the above embodiment, the dry etching has been explained as a typical embodiment. However, the same characteristic structure can be used to fix the showerhead or target in other plasma processing systems. In this first example, the plasma generation mechanism is not important. The plasma may be RF plasma or DC plasma, or any other type of plasma. Further, the top electrode may or may not contain gas inlets. For example, the characteristic structure can be used to fix the target in DC plasma assisted sputter deposition systems, where usually there are no gas inlets within the target.

In accordance with the first embodiment, since the showerhead 15 is fixed or attached to whole area of the lower surface of the top electrode 11 by the magnetic force based on the sheet-like magnetic assembly 22, the temperature uniformity of the showerhead or the target and the gas distribution below the gas showerhead can be improved.

Figure 4:
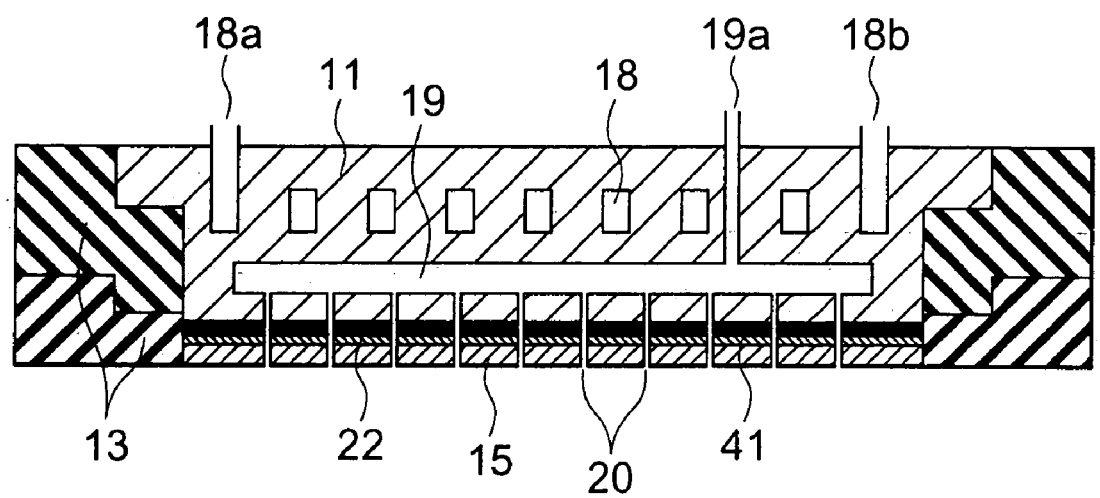
FIG. 4 is an enlarged longitudinal cross sectional view of a section including the top electrode unit and the showerhead in accordance with the second embodiment.

Next, the second embodiment of the present invention is explained by referring to FIG. 4. FIG. 4 shows an enlarged longitudinal cross sectional view of the section including the top electrode unit 11 and the showerhead 15. The second embodiment is an extension of the first embodiment. Therefore, in this second embodiment, only the characteristic section is shown and explained. The rest of the configuration is as same as those of the first embodiment.

The only difference between the first and second embodiments is the top electrode 11 is made of non-ferromagnetic metal such as aluminum (Al). Therefore, in order to attach the showerhead 15 with the sheet-like magnetic assembly 22, a thin ferromagnetic sheet 41 is attached to the lower surface of the top electrode 11, preferably by adhesive or glue. Usually, the non-magnetic metals such as Al have a higher thermal conductivity. Therefore, the use of the non-ferromagnetic metal for the top electrode 11 can improve the heat transfer between the coolant flowing within the cannel 18 and the top electrode 11. This results in a lower temperature rise of the showerhead 15. In addition, all of the merits explained in the first embodiment can be obtained by this structure.

Figure 5:
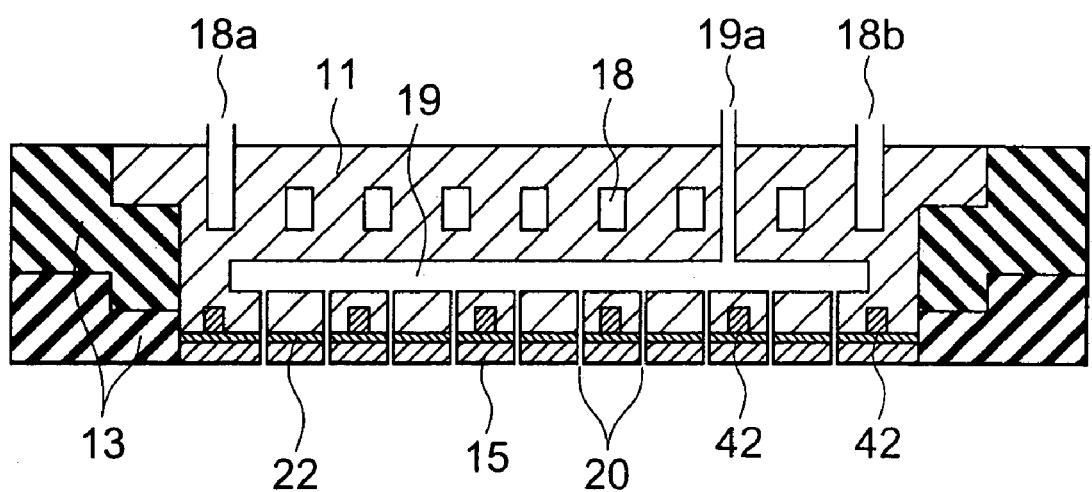
FIG. 5 is an enlarged longitudinal cross sectional view of a section including the top electrode unit and the showerhead in accordance with the third embodiment.
Figure 6:
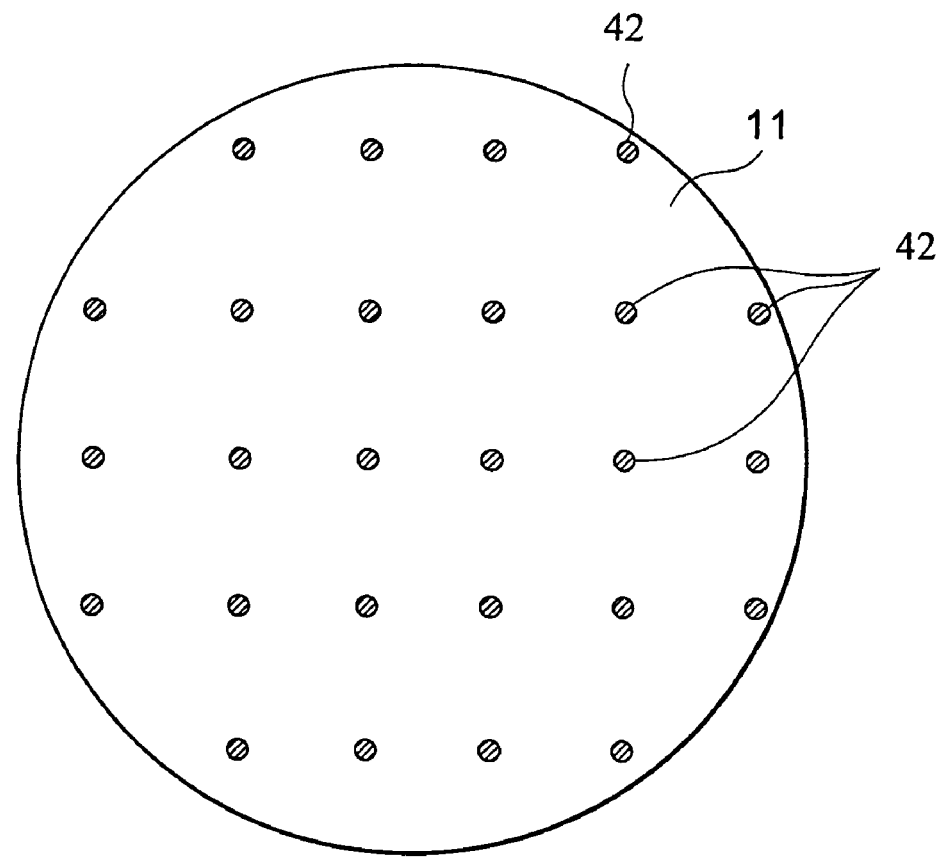
FIG. 6 is a bottom view of the top electrode of the third embodiment.

With reference to FIGS. 5 and 6, the third embodiment of the present invention is explained. FIG. 5 shows an enlarged longitudinal cross sectional view of the top electrode 11 and the showerhead 15. FIG. 6 shows a bottom view of the magnet arrangement on the lower surface of the top electrode 11.

The third embodiment is a modification of the second embodiment. The top electrode 11 is also made of metal such as Al. On the lower surface of the top electrode 11, a plurality of separate magnets 42 is arranged such that magnetic poles of each of the neighboring magnets are selected to have alternate polarity. The magnets 42 are placed in holes formed on the lower surface and glued to the holes. The number of the magnets 42 is not critical and can be determined optionally depending to the area of the lower surface of the top electrode 11. The magnets 42 are usually placed with a separation of about a few centimeters, for example, 4 cm. The magnets 42 can be randomly placed within the lower surface of the top electrode 11. The magnets 42 can be arranged without any specific pattern or with some pattern. For example, FIG. 6 shows a possible or preferable pattern of the magnet arrangement. The magnets 42 are placed in a lattice pattern.

The diameter in the cross sectional shape of the magnet 42 is not critical and may be in the range of 2–20 mm. The strength of the magnetic field is also not critical. Usually weak magnets with strength smaller than 200 Gauss are preferable. Because, the strong magnetic fields penetrate into the reactor 10 and change the plasma uniformity and chemistry.

The magnets 42 shown in FIG. 5 are simply placed in the holes made on the lower surface of the top electrode 11. Therefore, the lower surface of the magnets 42 and the lower surface of the top electrode 11 are on the same plane. The magnets 42 have to be bonded to the top electrode 11 by using glue or by other technique.

Figure 7:
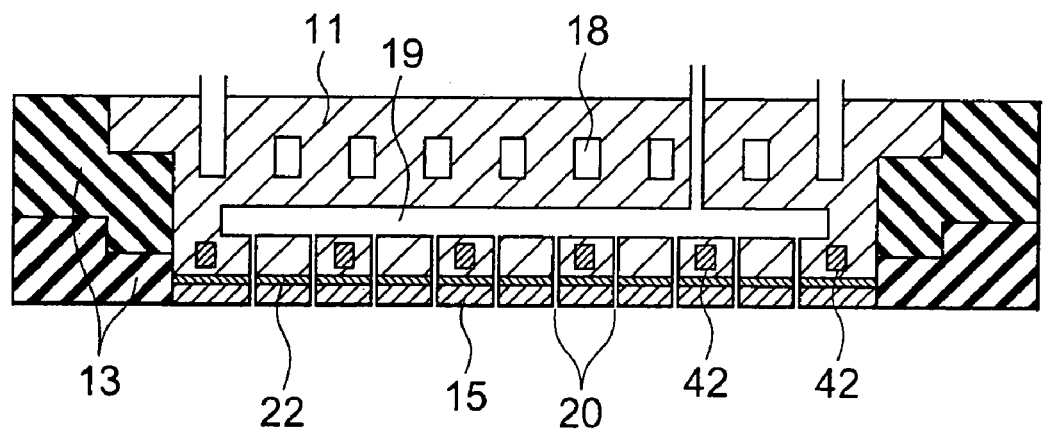
FIG. 7 is an enlarged longitudinal cross sectional view of a section including the top electrode unit and the showerhead as a modification of the third embodiment.

Also, instead of gluing the magnets 42 to the holes as explained in the third embodiment, they may be buried within the top electrode 11 as shown in FIG. 7.

The above third embodiment and its modifications result in a lower temperature rise of the showerhead 15. All of the merits explained in the above first embodiment can be obtained by the third embodiment.

Figure 8:
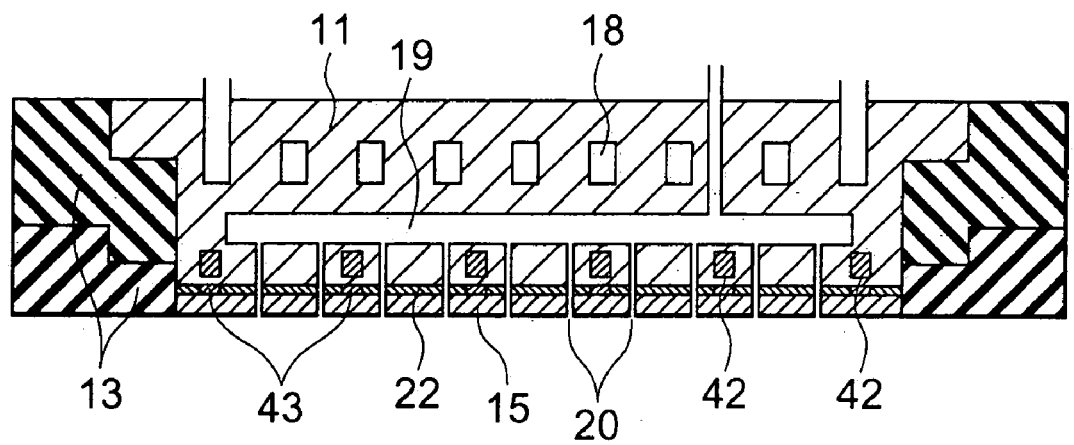
FIG. 8 is an enlarged longitudinal cross sectional view of a section including the top electrode unit and the showerhead in accordance with the fourth embodiment.
Figure 9:
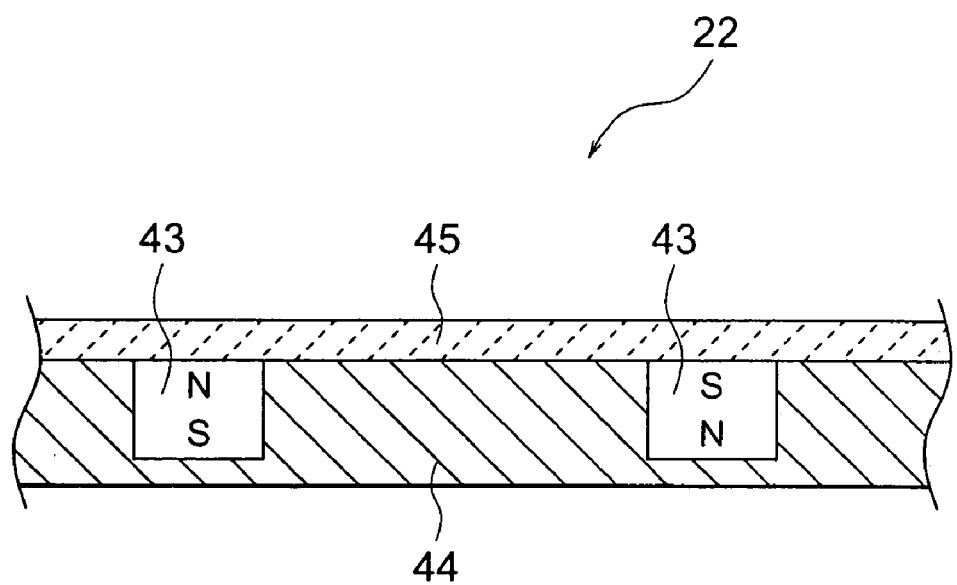
FIG. 9 is an enlarged longitudinal cross sectional view of the metal sheet of the fourth embodiment.

Next, the fourth embodiment of the present invention is explained by referring to FIGS. 8 and 9. The fourth embodiment is a modification of the third embodiment. In this embodiment, instead of the sheet-like magnetic assembly 22, separate magnets 43 are used. These magnets 43 are placed on the upper surface of the showerhead 15. The arrangement of the magnets 43 corresponds to the arrangement of magnets 42 respectively. The rest configuration is as same as that of the third embodiment. The magnetic pole of each magnet 43 is selected to have opposite polarity with respect to the corresponding magnet 42 in the top electrode 11. As shown in FIG. 9, the magnets 43 are supported by the ferromagnetic metal sheet 44. In addition, a deformable sheet 45 is attached to the upper surface of the ferromagnetic metal sheet 44 to cover the magnets 43. The magnet unit including the magnets 43 makes another type of sheet-like magnetic assembly. It should be noted that the use of the deformable sheet 45 is desirable to eliminate the formation of the voids between the top electrode 11 and the showerhead 15. However, the deformable sheet 45 is not essential. Further, the purpose of the ferromagnetic metal sheet 44 is only to cut off the penetration of the magnetic flux into the reactor 10.

As the modification of the fourth embodiment, one can use the showerhead 15 with only the thin ferromagnetic metal sheet 44. In this case, the magnets 43 and the deformable sheet 45 are not used. The showerhead 15 is then attached to the top electrode 11 only by the magnetic force generated by the magnets 42 within the top electrode 11.

The above fourth embodiment and its modification result in a lower temperature rise of the showerhead 15. All of the merits explained in the above first embodiment can be obtained by the fourth embodiment etc.

Figure 10:
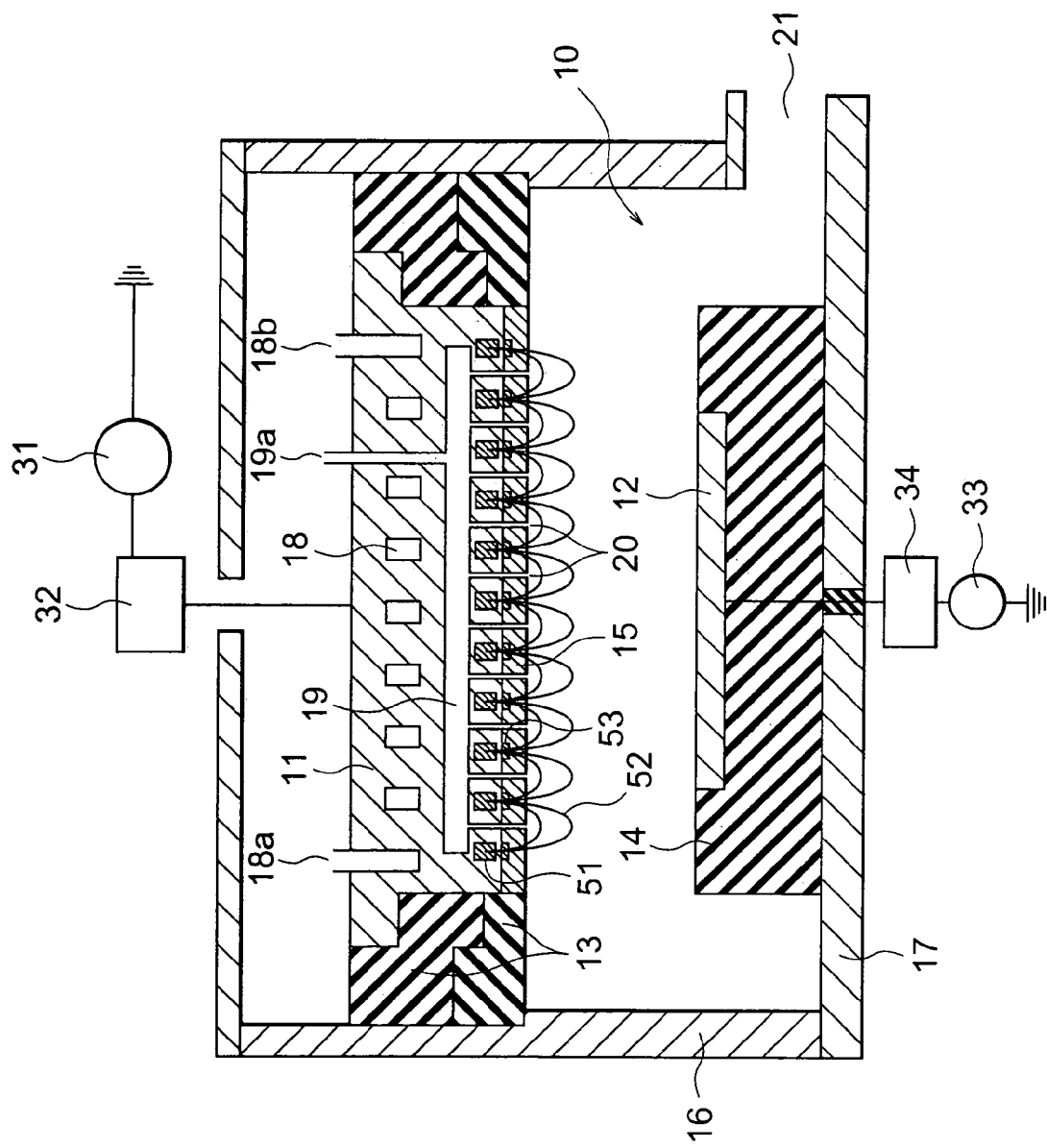
FIG. 10 is a longitudinal cross sectional view of a reactor of the fifth embodiment.

Next, the fifth embodiment of the present invention will be explained by referring to FIGS. 10, 11 and 12. FIG. 10 shows a longitudinal cross sectional view of the fifth embodiment of the present invention. The reactor 10 of this embodiment is a plasma-processing reactor. There is a plurality of magnets 51 placed in holes made within the top electrode 11.

The magnets 51 are arranged in a noncircular configuration with respect to a center of the top electrode 11. The magnets 51 are arranged in an orthogonal configuration along perpendicular lines such that a polarity of each of the magnets facing the inside of the reactor 10 is opposite to that of linearly adjacent magnets and the same as diagonally adjacent magnets.

This arrangement of magnets 51 generates closed magnetic fluxes 52 near the lower surface of the top electrode 11 as shown in FIG. 10. It should be noted that magnets 51 are not necessarily placed within holes made in the top electrode 11. Instead, one can place the magnets 51 on the upper surface of the top electrode 11 to get the same pattern of magnetic fluxes 52. For the clarity of the diagram, magnetic fluxes 52 are shown only at the lower side of the top electrode 11.

The showerhead 15 is also made of a dielectric or a semiconductor material. On the upper surface of showerhead 15, thin metal plates 53 are arranged with the pattern the same as magnet arrangement of the magnets 51.

Figure 11:
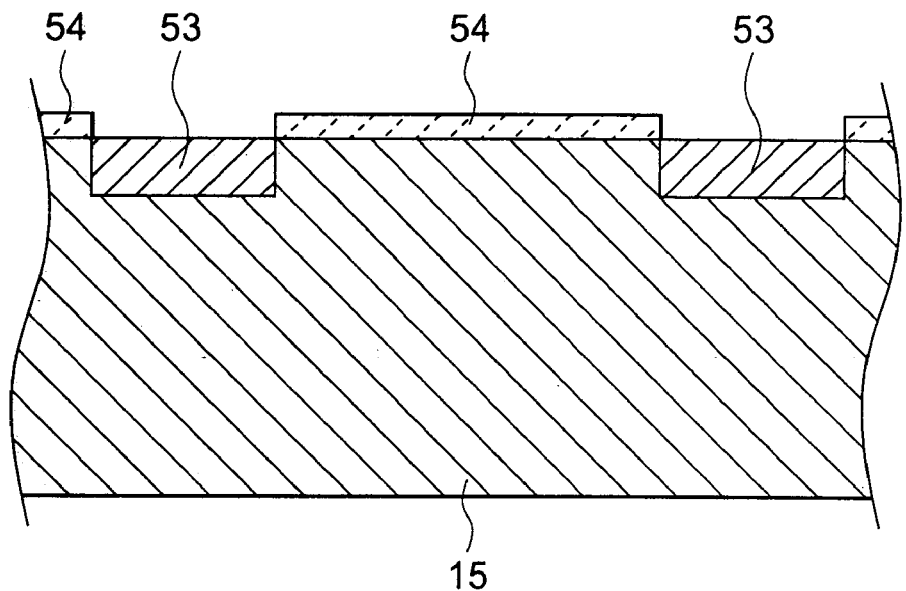
FIG. 11 is a partially enlarged longitudinal cross sectional view of the gas showerhead of the fifth embodiment.
Figure 12:
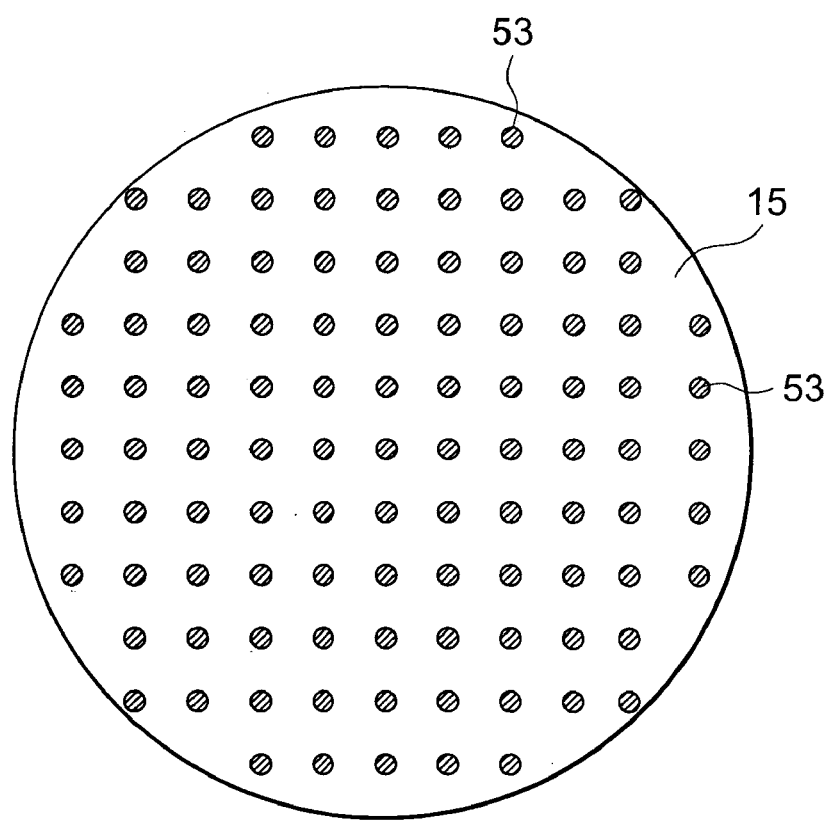
FIG. 12 is a plane view of the upper surface of the gas showerhead of the fifth embodiment.

A partially enlarged cross sectional and upper views of the showerhead 15 is shown in FIGS. 11 and 12, respectively. The thin metal plates 53 are made of a magnetic metal, for example, iron. The thickness of the thin metal plate 53 is not critical and usually lies around 1 mm. The thin metal plates 53 are tightly bonded to the showerhead 15. Usually, the thin metal plates 53 are placed in holes made on the upper surface of the showerhead 15 as shown in FIG. 11.

Further, there may be a thin sheet of deformable material 54 on the upper surface of the showerhead 15. The purpose of the deformable sheet 54 is to make proper contact with the top electrode 11 and to increase the contact surface area. Use of the deformable sheet 54 is however is not essential.

One can use a different method to introduce process gas into the reactor 10. Moreover, in almost all of the sputter deposition reactors gas is not introduced through the top electrode 11, instead of that, the gas inlets placed around the side-wall or bottom plate of the reactor 10 are used.

Figure 13:
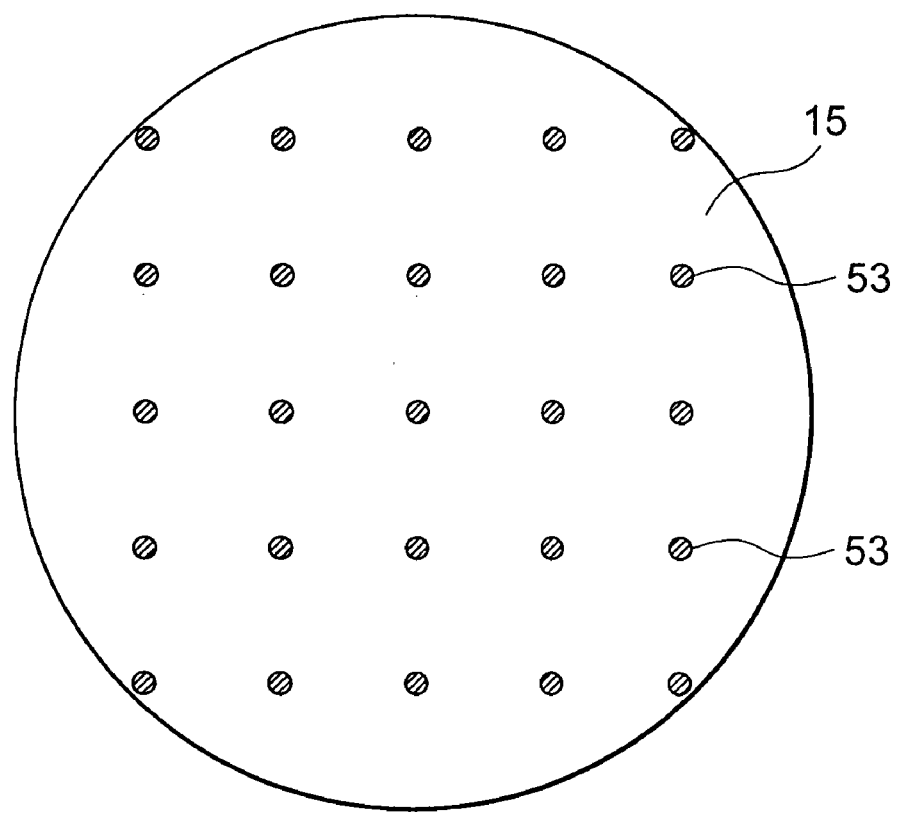
FIG. 13 is a plane view of the upper surface of another gas showerhead of the fifth embodiment.

The arrangement of the thin metal plates 53 is not necessarily be the same as that of magnet arrangement. Instead, one can place the thin metal plate 53 in an arbitrary position, for example as shown in FIG. 13. The only requirement as to the above arrangement is that at least a part of any thin metal plate 53 has to be directly below a magnet 51 and the magnetic force generated between the magnets 51 and the thin metal plates 53 has to be large enough to tightly attach the showerhead 15 to the top electrode 11.

Figure 14:
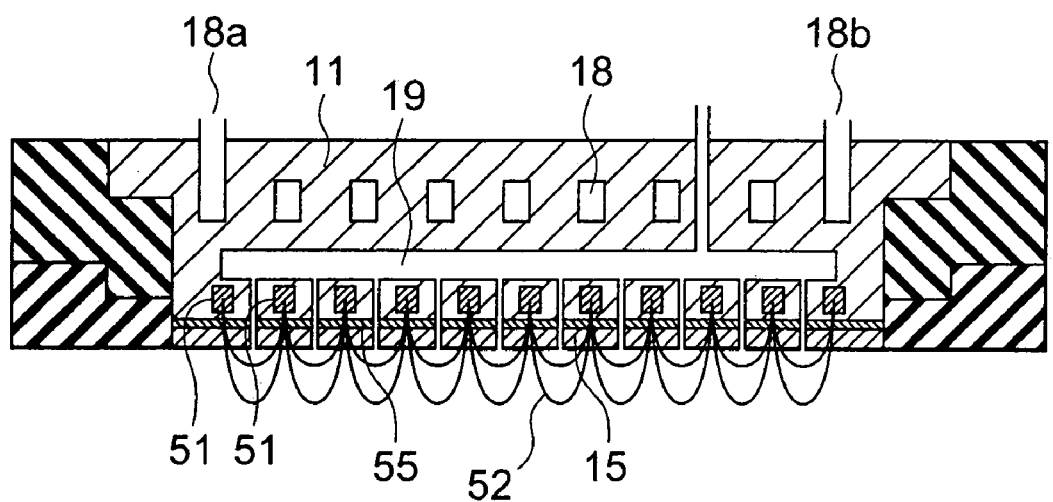
FIG. 14 is a longitudinal cross sectional view of another structure including the top electrode and the showerhead.

Moreover, one can use a large single sheet of the thin metal 55 instead of separate small pieces, as shown in FIG. 14. However, in this case the magnetic flux density below the gas showerhead 15 gets slightly weaken. Because, a fraction of magnetic flux that coming from one magnet 51 passes through the thin metal sheet 55 to the nearest magnet 51. The metal sheet 55 can be attached to the showerhead using any bonding technique.

The operation of the above structure having the thin metal plates 53 is explained. When the magnets 51 and the thin metal plates 53 are arranged as explained above, attractive magnetic forces are generated between them. If the number of the thin-metal plates 53 is sufficient to generate large magnetic force, the gas showerhead 15 gets fixed to the top electrode 11 just by magnetic force.

Figure 15:
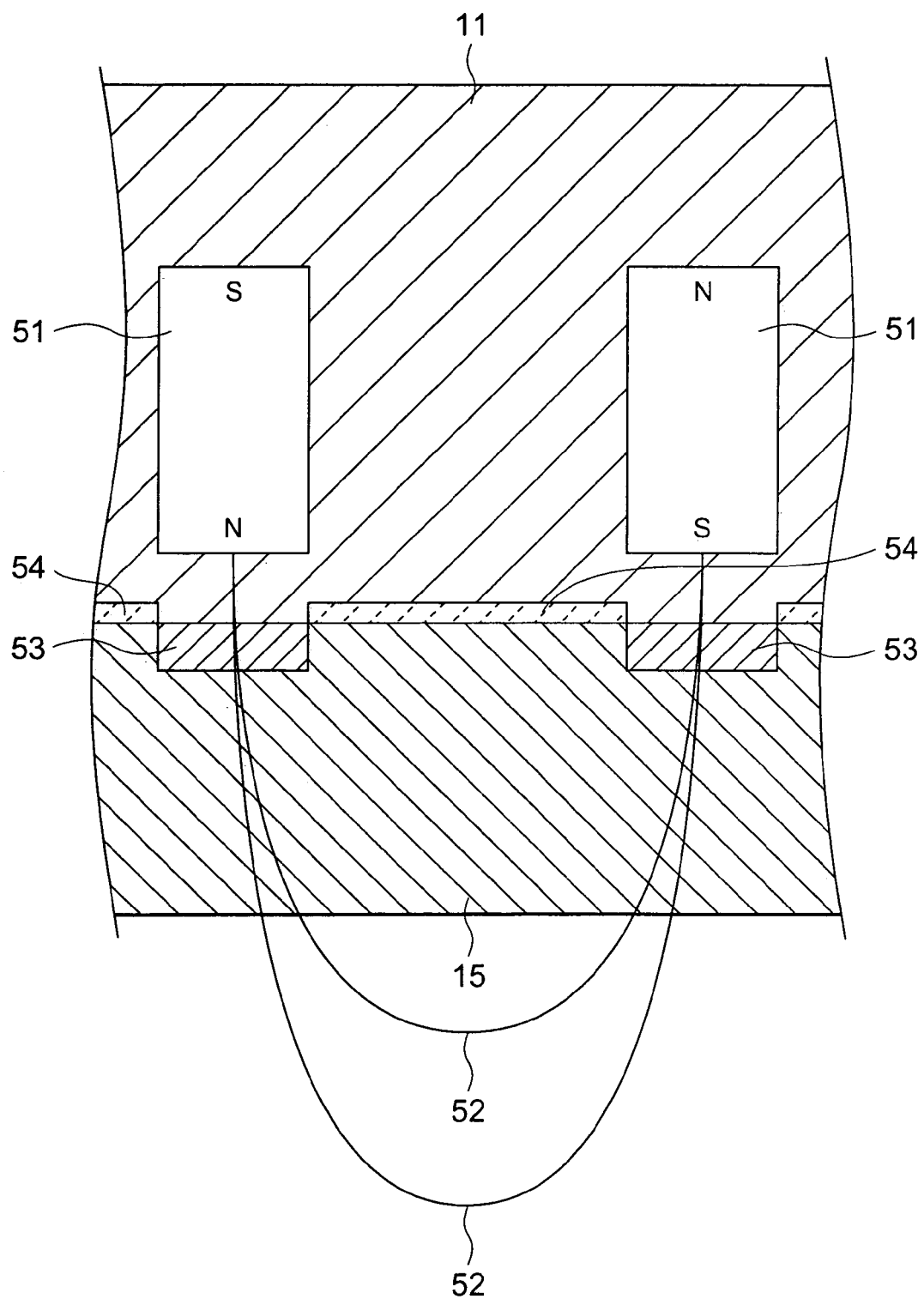
FIG. 15 is a partially enlarged longitudinal cross sectional view of the showerhead using thin metal plates.

Magnetic flux passes through the thin metal plates 53 without degradation of field strength as shown in FIG. 15. This is because each thin metal plate 53 is separated and each magnetic field line 52 has to be a closed loop. Therefore, the pattern of magnetic flux (52), that is closed magnetic fluxes shown in FIG. 16, has no influence by the thin metal plates 52. Therefore, the use of thin metal plates 53 has no influence for the plasma generation mechanism or plasma parameters.

Figure 16:
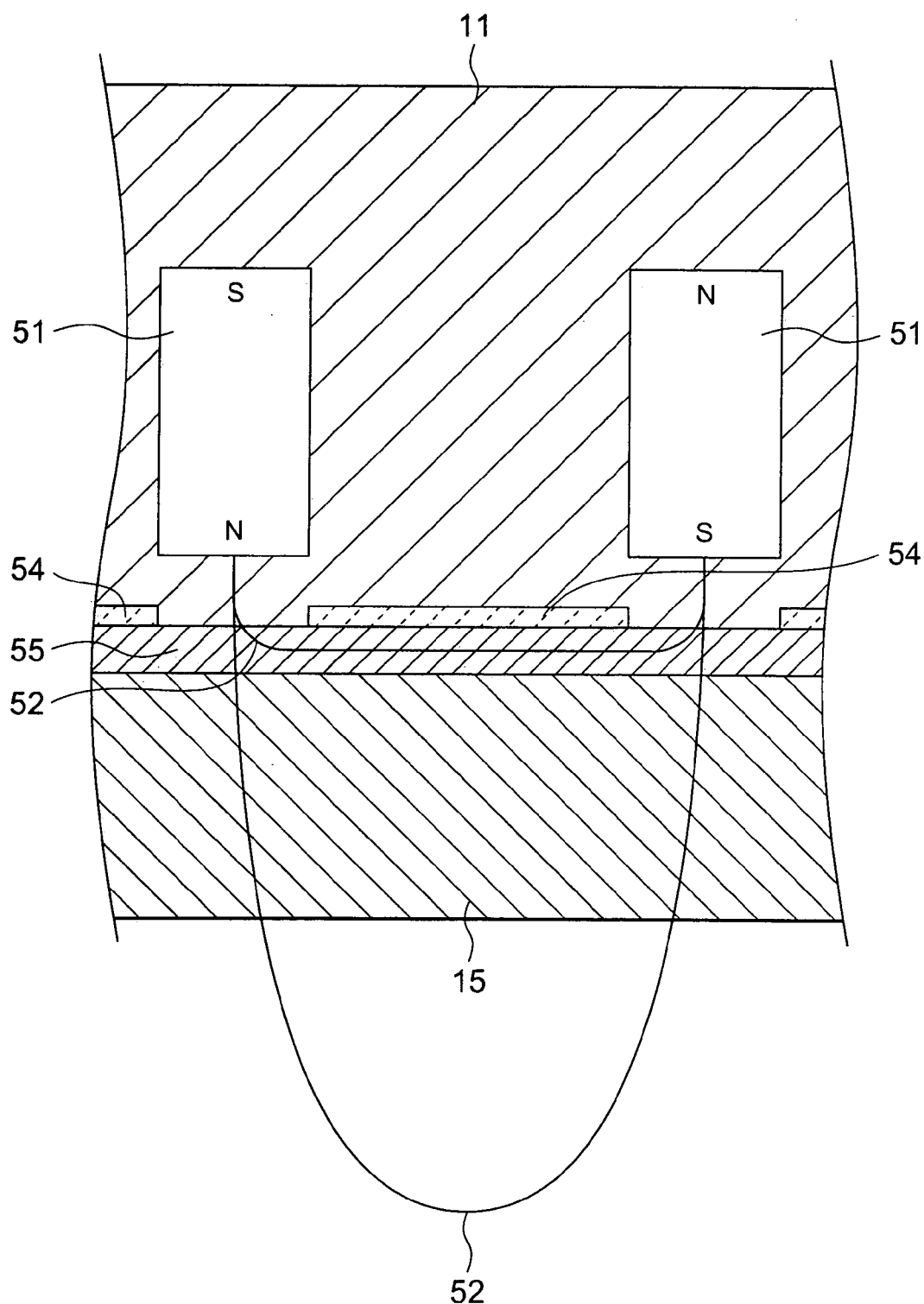
FIG. 16 is a partially enlarged longitudinal cross sectional view of the showerhead using thin metal sheet.

However, if a large continuous thin metal sheet 55 shown in FIG. 14 is used instead of the separate thin metal plates 53, the magnetic flux density below the showerhead 15 gets weakened. The reason is that a fraction of magnetic flux transport through the thin metal sheet 55 as shown in FIG. 16. However, by using the very thin metal sheet 55, lose of magnetic flux density can be minimized.

The above-mentioned configuration of the magnets 51 and the thin-metal plates 53 tightly fix the top electrode 11 and the gas showerhead 15 together. This improves the thermal conductance between the showerhead 15 and the top electrode 11, which causes a better temperature uniformity on the showerhead 15. Moreover, due to the tight fixing of the showerhead 15 to the top electrode 11 through their entire surface area, voids are not generated between them. This will improves the gas distribution into the reactor 10.

In accordance with the fifth embodiment, the technique to fix the gas showerhead or the target plate to the RF or DC electrode improve the temperature uniformity of the showerhead or the target, and gas distribution below the gas showerhead.

Figure 17:
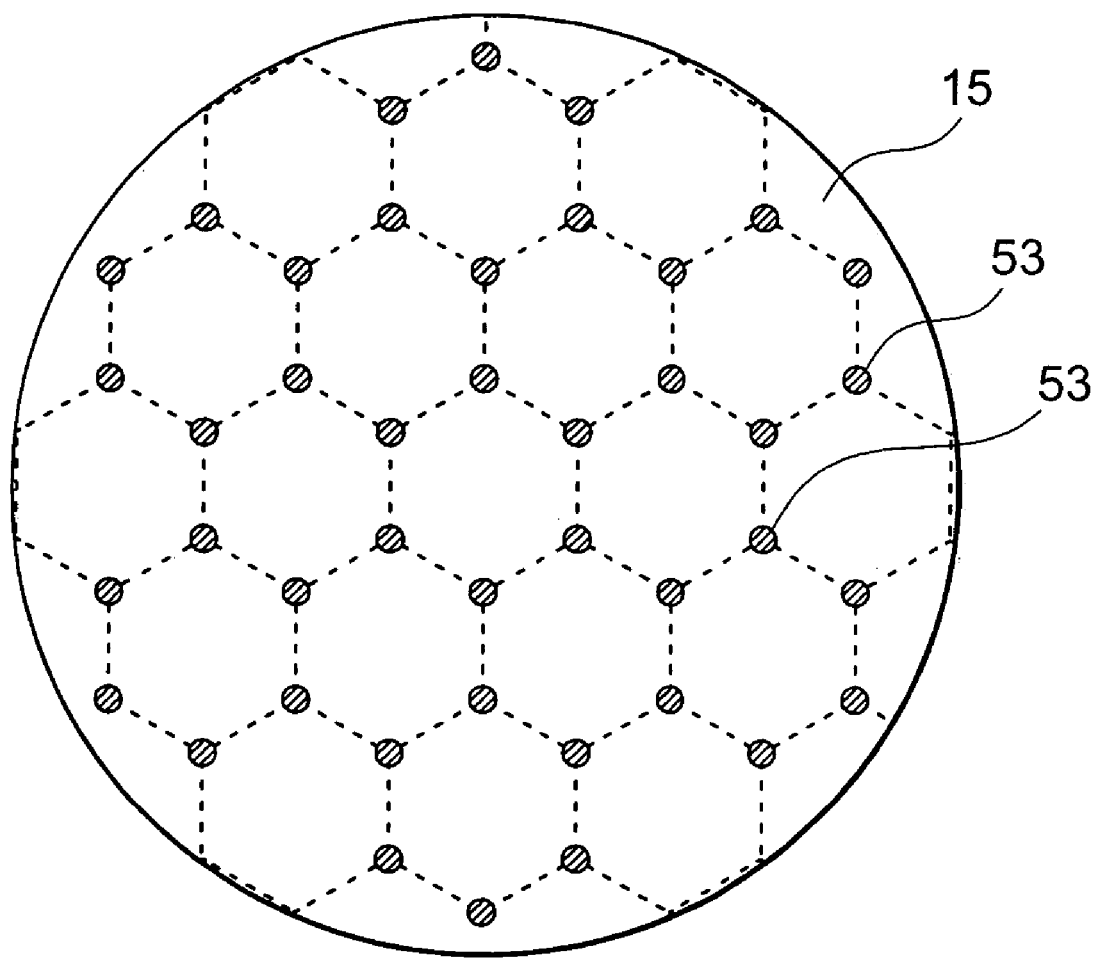
FIG. 17 is a plane view of the upper surface of the another gas showerhead of the sixth embodiment.
Figure 18:
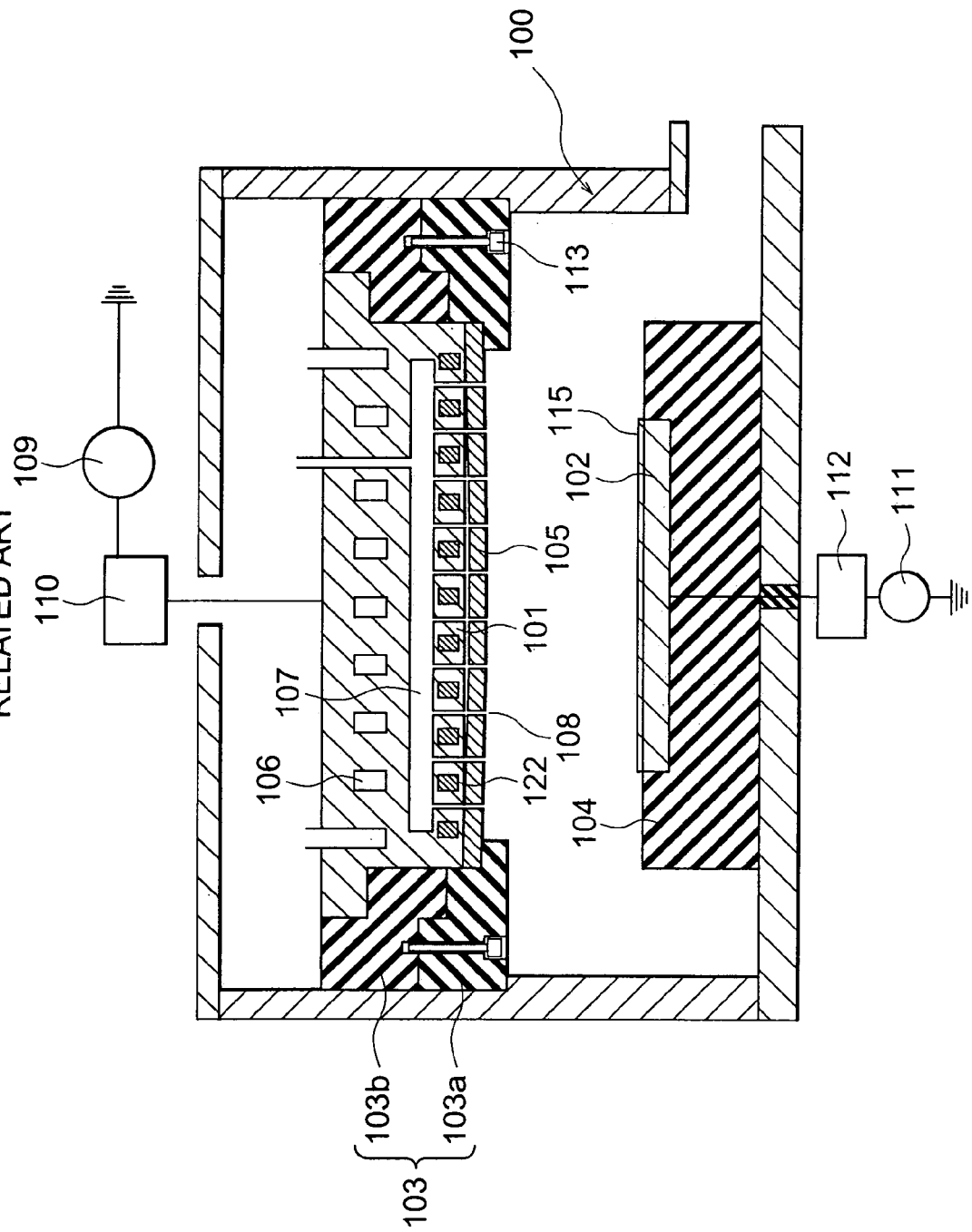
FIG. 18 is a longitudinal cross sectional view of a reactor of the conventional plasma processing system.
Figure 19:
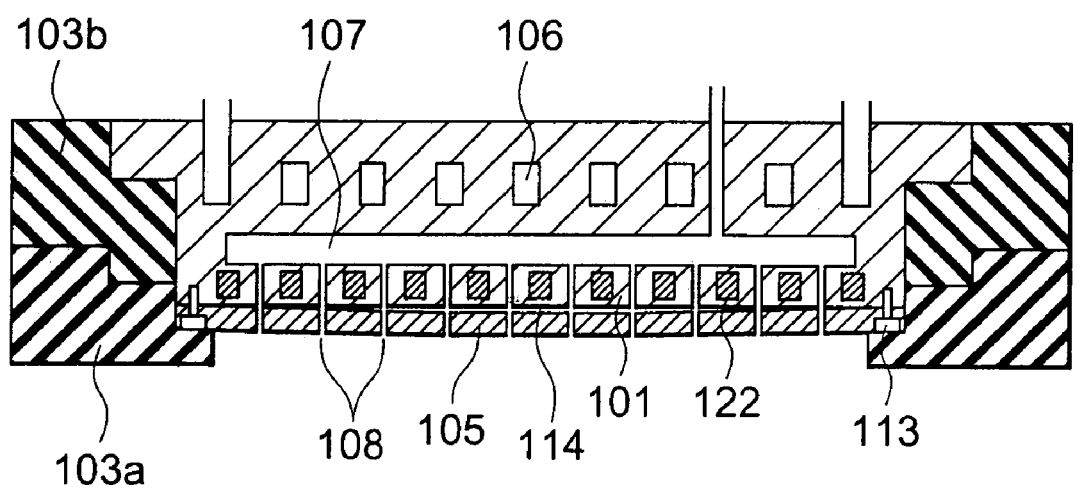
FIG. 19 is a partial longitudinal cross sectional view of the other conventional structure including a top electrode and showerhead.

The sixth embodiment is an extension of the fifth embodiment and is explained with reference to FIG. 17. Here the only difference, in comparison with the fifth embodiment, is the arrangements of the magnets 51 and the thin metal plates 53. FIG. 17 shows the arrangement of the thin metal plates 53 on the upper surface of the gas showerhead 15. That is, the magnets 51 in the top electrode 11 are also arranged with the same pattern. The plurality of magnets 51 is arranged on the heads of hexagonal configurations, which lie attached to each other as in a honeycomb. Any two magnets on the same foot have opposite polarity facing the inside of the reactor 10. This magnet arrangement also generates closed magnetic fluxes near the lower surface of the showerhead 15.

Further, similar to the fifth embodiment, it is not necessary to place a thin metal plate 53 below each magnet 51. One can arbitrarily select suitable positions to place thin metal plates. This configuration of magnets and thin metal plates also yield the same benefits stated in the fifth embodiment.

The above embodiments are explained with reference to unique arrangement of magnets 51. However, any other magnet arrangement and a suitable thin metal plate arrangement can be employed to fix the showerhead or target plate to the RF or DC electrode. Accordingly, the structure or method given in this invention can be appropriately modified depending on the type and dimensions of plasma processing reactor and the type of processing parameters.

The present disclosure relates to subject matter contained in Japanese Patent Application No. 2003-181158, filed on Jun. 25, 2003, the disclosure of which is expressly incorporated herein by reference in its entirety.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A device for fixing a gas showerhead or target plate to an electrode in a plasma processing system, the device comprising:
    a reactor,
    a top electrode made of a magnetic or ferromagnetic metal, or a metal-alloy that has ferromagnetic properties, wherein a RF or DC power is applied to generate plasma within the reactor,
    a gas showerhead or target plate fixed to the top electrode,
    a sheet-like magnetic assembly bound to an upper surface of the showerhead or target plate, which sheet-like magnetic assembly is comprised of a plurality of magnets, a metal sheet made of a ferromagnetic metal, and a deformable film.

2. The device according to claim 1, wherein the device is for fixing a gas showerhead to an electrode in a plasma processing system.

3. A device for fixing a gas showerhead or target plate to an electrode in a plasma processing system, the device comprising:
    a reactor,
    a top electrode made of a metal, wherein a RF or DC power is applied to generate plasma within the reactor,
    a gas showerhead or target plate fixed to the top electrode,
    a thin plate made of magnetic metal or metal-alloy, or ferromagnetic metal which is attached to a lower surface of the top electrode, and
    a sheet-like magnetic assembly bound to an upper surface of the showerhead or target plate; which sheet-like magnetic assembly is comprised of a plurality of magnets, a metal sheet made of a ferromagnetic metal, and a deformable film.

4. The device according to claim 2, wherein the device is for fixing a gas showerhead to an electrode in a plasma processing system.

5. A device for fixing a gas showerhead or target plate to an electrode in a plasma processing system, the device comprising:
    a reactor,
    a top electrode made of a metal, wherein a RF or DC power is applied to generate plasma within the reactor,
    a gas showerhead or target plate fixed to the top electrode,
    a plurality of separate magnets arranged within a lower surface section of the top electrode, and
    a sheet-like magnetic assembly bound to an upper surface of the showerhead or target plate, which sheet-like magnetic assembly is comprised of a plurality of separate magnets, a metal sheet made of a ferromagnetic metal, and a deformable film.

6. The device according to claim 5, wherein the device is for fixing a gas showerhead to an electrode in a plasma processing system.

7. A device for fixing a gas showerhead or target plate to an electrode in a plasma processing system, the device comprising:
    a reactor,
    a top electrode made of a metal, wherein a RF or DC power is applied to generate plasma within the reactor,
    a gas showerhead or target plate fixed to the top electrode,
    a plurality of separate magnets arranged within a lower surface section of the top electrode, and
    a plurality of separate magnets separately fixed to an upper surface of the showerhead or target plate, wherein the position of the magnets overlap with those placed within the top electrode,
    wherein the magnets within the top electrode and the magnets on the showerhead or target plate are arranged such that attractive forces are generated between any two magnets which lie in the same magnetic axes.

8. The device for fixing a gas showerhead or target plate to an electrode in a plasma processing system as claimed in claim 7, wherein said showerhead or target plate has a thin ferromagnetic metal sheet on its upper surface without magnets.

9. The device according to claim 7, wherein the device is for fixing a gas showerhead to an electrode in a plasma processing system.

10. Device for fixing a gas showerhead or target plate to an electrode in a magnetic field assisted plasma processing system, the device comprising:
    a reactor,
    a top electrode made of a nonmagnetic metal, wherein a RF or DC power is applied to generate plasma within the reactor,
    a plurality of magnets separately arranged within an inner surface section of the top electrode in order to generate closed magnetic fluxes near an inner surface of the top electrode, and
    a gas showerhead or target plate fixed to said top electrode, wherein magnetic metal is attached to an upper surface of said gas showerhead or said target plate.

11. The device for fixing a gas showerhead or target plate to an electrode in a magnetic field assisted plasma processing system, as claimed in claim 10, wherein the magnets are arranged in a noncircular configuration with respect to a center of the top electrode and in an orthogonal configuration along perpendicular lines such that a polarity of each of the magnets facing an inside of said reactor is opposite to that of linearly adjacent magnets and the same as diagonally adjacent magnets.

12. The device for fixing a gas showerhead or target plate to an electrode in a magnetic field assisted plasma processing system, as claimed in claim 11, wherein the magnetic metal is a plurality of separate thin magnetic metal plates, and the separate thin metal plates are arranged to be aligned with each of the magnets or with only selected one of them within the top electrode, and at least a part of the surface area of the thin magnetic metal plate lies just below the relevant magnet.

13. The device for fixing a gas showerhead or target plate to an electrode in a magnetic field assisted plasma processing system, as claimed in claim 11, wherein the magnetic metal is a single thin metal sheet.

14. The device for fixing a gas showerhead or target plate to an electrode in a magnetic field assisted plasma processing system, as claimed in claim 10, wherein the magnets are arranged on heads of hexagonals, which lie as a honeycomb structure such that a polarity of each of said magnets facing the inside of said reactor is opposite to that of linearly adjacent magnets.

15. The device for fixing a gas showerhead or target plate to an electrode in a magnetic field assisted plasma processing system, as claimed in claim 14, wherein the magnetic metal is a plurality of separate thin magnetic metal plates, and the separate thin metal plates are arranged to be aligned with each of the magnets or with only selected one of them within the top electrode, and at least a part of the surface area of the thin magnetic metal plate lies just below the relevant magnet.

16. The device for fixing a gas showerhead or target plate to an electrode in a magnetic field assisted plasma processing system, as claimed in claim 14, wherein the magnetic metal is a single thin metal sheet.

17. The device for fixing a gas showerhead or target plate to an electrode in a magnetic field assisted plasma processing system, as claimed in claim 10, wherein the magnetic metal is a plurality of separate thin magnetic metal plates, and the separate thin metal plates are arranged to be aligned with each of the magnets or with only selected one of them within the top electrode, and at least a part of the surface area of the thin magnetic metal plate lies just below the relevant magnet.

18. The device for fixing a gas showerhead or target plate to an electrode in a magnetic field assisted plasma processing system, as claimed in claim 10, wherein the magnetic metal is a single thin metal sheet.

19. The device according to claim 10, wherein the device is for fixing a gas showerhead to an electrode in a magnetic field assisted plasma processing system.

20. An electrode unit through which a RF or DC power is applied to generate plasma within an reactor, which is used for plasma processing of substrates and is provided with a gas showerhead or target on its surface facing the inside of the reactor, wherein:

the electrode is made of material having ferromagnetic property, and a sheet-like magnetic assembly is bonded to an upper surface of the showerhead or target plate, which sheet-like magnetic assembly is comprised of a plurality of separate magnets, a metal sheet made of a ferromagnetic metal and a deformable film.

21. The electrode unit according to claim 20, wherein the electrode unit is provided with a gas showerhead on its surface facing the inside of the reactor.

22. An electrode unit through which a RF or DC power is applied to generate plasma within an reactor, which reactor is used for plasma processing of substrates and is provided with a gas showerhead or target on its surface facing the inside of the reactor, wherein:

the electrode is made of metal, a thin plate made of material having ferromagnetic property is attached to a surface of the electrode, and a sheet-like magnetic assembly is bonded to an upper surface of the showerhead or target plate, which sheet-like magnetic assembly is comprised of a plurality of separate magnets, a metal sheet made of a ferromagnetic metal and a deformable film.

23. The electrode unit according to claim 22, wherein the electrode unit is provided with a gas showerhead on its surface facing the inside of the reactor.

24. An electrode unit through which a RF or DC power is applied to generate plasma within a reactor, which reactor is used for plasma processing of substrates and is provided with a gas showerhead or target on its surface facing the inside of said reactor, wherein:

the electrode is made of metal, a plurality of separate magnets is arranged within said electrode, and a sheet-like magnetic assembly is bonded to an upper surface of said showerhead or target plate, which sheet-like magnetic assembly is comprised of a plurality of separate magnets, a metal sheet made of a ferromagnetic metal and a deformable film.

25. The electrode unit according to claim 24, wherein the electrode unit is provided with a gas showerhead on its surface facing the inside of said reactor.

26. An electrode unit through which a RF or DC power is applied to generate plasma within a reactor, which reactor is used for plasma processing of substrates and is provided with a gas showerhead or target on its surface facing the inside of said reactor, wherein:

the electrode is made of metal, a plurality of separate magnets is arranged within said electrode, and a sheet provided with a plurality of magnets is bonded to an upper surface of said showerhead or target plate, which sheet-like magnetic assembly is comprised of a plurality of separate magnets, a metal sheet made of a ferromagnetic metal and a deformable film.

27. The electrode unit according to claim 26, wherein the electrode unit is provided with a gas showerhead on its surface facing the inside of said reactor.

* * * * *